(12) United States Patent
Kolesnychenko et al.

(10) Patent No.: US 7,012,673 B2
(45) Date of Patent: Mar. 14, 2006

(54) LITHOGRAPHIC APPARATUS AND DEVICE MANUFACTURING METHOD

(75) Inventors: Aleksey Yurievich Kolesnychenko, Helmond (NL); Jan Evert Van Der Werf, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 52 days.

(21) Appl. No.: 10/866,077

(22) Filed: Jun. 14, 2004

(65) Prior Publication Data

US 2005/0002004 A1 Jan. 6, 2005

(30) Foreign Application Priority Data

Jun. 27, 2003 (EP) .................................. 03254116

(51) Int. Cl.
*G03B 27/42* (2006.01)
*G03B 27/52* (2006.01)

(52) U.S. Cl. .............................. 355/53; 355/30; 355/62
(58) Field of Classification Search ...................... None
See application file for complete search history.

(56) References Cited

U.S. PATENT DOCUMENTS

| | | | | |
|---|---|---|---|---|
| 3,573,975 | A | 4/1971 | Dhaka et al. ................ | 117/212 |
| 3,648,587 | A | 3/1972 | Stevens ......................... | 95/44 |
| 4,346,164 | A | 8/1982 | Tabarelli et al. ............ | 430/311 |
| 4,390,273 | A | 6/1983 | Loebach et al. ............ | 355/125 |
| 4,396,705 | A | 8/1983 | Akeyama et al. ........... | 430/326 |
| 4,480,910 | A | 11/1984 | Takanashi et al. ............ | 355/30 |
| 4,509,852 | A | 4/1985 | Tabarelli et al. ............ | 355/30 |
| 5,040,020 | A | 8/1991 | Rauschenbach et al. ...... | 355/53 |
| 5,121,256 | A | 6/1992 | Corle et al. ................. | 359/664 |
| 5,610,683 | A | 3/1997 | Takahashi .................... | 355/53 |
| 5,715,039 | A | 2/1998 | Fukuda et al. ................ | 355/53 |
| 5,825,043 | A | 10/1998 | Suwa .......................... | 250/548 |
| 5,900,354 | A | 5/1999 | Batchelder .................. | 430/395 |
| 6,191,429 | B1 | 2/2001 | Suwa .......................... | 250/548 |
| 6,236,634 | B1 | 5/2001 | Lee et al. .................... | 369/112 |
| 6,560,032 | B1 | 5/2003 | Hatano ....................... | 359/656 |
| 6,600,547 | B1 | 7/2003 | Watson et al. | |
| 6,603,130 | B1 | 8/2003 | Bisschops et al. ........ | 250/492.1 |
| 6,633,365 | B1 | 10/2003 | Suenaga ...................... | 355/53 |
| 6,809,794 | B1 * | 10/2004 | Sewell ......................... | 355/30 |
| 2002/0020821 | A1 | 2/2002 | Van Santen et al. ........ | 250/492 |
| 2002/0163629 | A1 | 11/2002 | Switkes et al. ............... | 355/53 |
| 2003/0123040 | A1 | 7/2003 | Almogy ....................... | 355/69 |
| 2003/0174408 | A1 | 9/2003 | Rostalski et al. ........... | 359/642 |
| 2004/0000627 | A1 | 1/2004 | Schuster | |

(Continued)

FOREIGN PATENT DOCUMENTS

DD 206 607 2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Peter B. Kim
(74) *Attorney, Agent, or Firm*—Pillsbury Winthrop Shaw Pittman LLP

(57) ABSTRACT

Liquid is supplied to a space between a projection system of a lithographic apparatus and a substrate, but there is a space between the liquid and the substrate. An evanescent field may be formed between the liquid and the substrate allowing some photons to expose the substrate. Due to the refractive index of the liquid, the resolution of the system may be improved and liquid on the substrate may be avoided.

21 Claims, 3 Drawing Sheets

U.S. PATENT DOCUMENTS

| | | |
|---|---|---|
| 2004/0021844 A1 | 2/2004 | Suenaga |
| 2004/0075895 A1 | 4/2004 | Lin .............................. 359/380 |
| 2004/0109237 A1 | 6/2004 | Epple et al. |
| 2004/0119954 A1 | 6/2004 | Kawashima et al. .......... 355/30 |
| 2004/0125351 A1 | 7/2004 | Krautschik et al. ........... 355/53 |

FOREIGN PATENT DOCUMENTS

| | | |
|---|---|---|
| DD | 221 563 | 4/1985 |
| DD | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", FUTURE FAB International, vol. 15, Jul. 11, 2003.

H. Kawata et al., "Fabrication of 0.2 $\mu$m Fine Patterns Using Optical Projection Lithography with an Oil Immersion Lens", Jpn. J. Appl. Phys. vol. 31 (1992), pp. 4174-4177.

G. Owen et al., "1/8 $\mu$m Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics Technology/World, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, J. Microlith., Microfab., Microcryst. 1(1):7-12 (2002).

L. P. Ghislain et al., "Near-field Photolithography with a Solid Immersion Lens," Applied Physics Letters, Jan. 25, 1999, vol. 74, No. 4., pp. 501-503.

European Search Report for European Application No. 03 25 4116.1, completed May 19, 2004.

U.S. Appl. No. 10/820,227, filed Apr. 8, 2004, De Smit.
U.S. Appl. No. 10/860,662, filed Jun. 4, 2004, De Smit.
U.S. Appl. No. 10/773,461, filed Feb. 9, 2004, Duineveld et al.
U.S. Appl. No. 10/698,012, filed Oct. 31, 2003, Flagello et al.
U.S. Appl. No. 10/705,804, filed Nov. 12, 2003, De Smit et al.
U.S. Appl. No. 10/705,805, filed Nov. 12, 2003, Lof et al.
U.S. Appl. No. 10/705,783, filed Nov. 12, 2003, Lof et al.
U.S. Appl. No. 10/743,271, filed Dec. 23, 2003, Van Santen et al.
U.S. Appl. No. 10/743,266, filed Dec 23, 2003, Mulkens et al.
U.S. Appl. No. 10/705,785, filed Nov 12, 2003, Derksen et al.
U.S. Appl. No. 10/724,402, filed Dec. 1, 2003, Simon et al.
U.S. Appl. No. 10/715,116, filed Nov. 18, 2003, Bleeker.

U.S. Appl. No. 10/719,683, filed Nov. 24, 2003, Streefkerk et al.
U.S. Appl. No. 10/705,816, filed Nov. 12, 2003, Lof et al.
U.S. Appl. No. 10/775,326, filed Feb. 11, 2004, Dierichs.

U.S. Appl. No. 10/857,614, filed Jun. 1, 2004, Lof et al.
U.S. Appl. No.10/367,910, filed Feb. 19, 2003, Suwa et al.

* cited by examiner

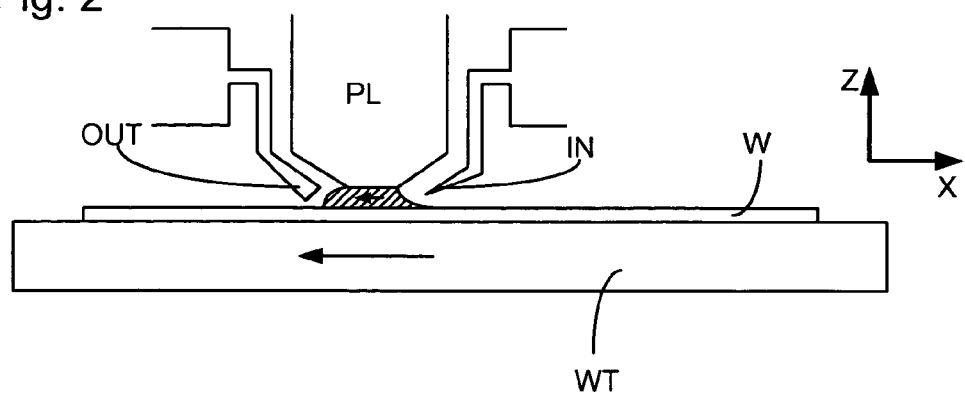
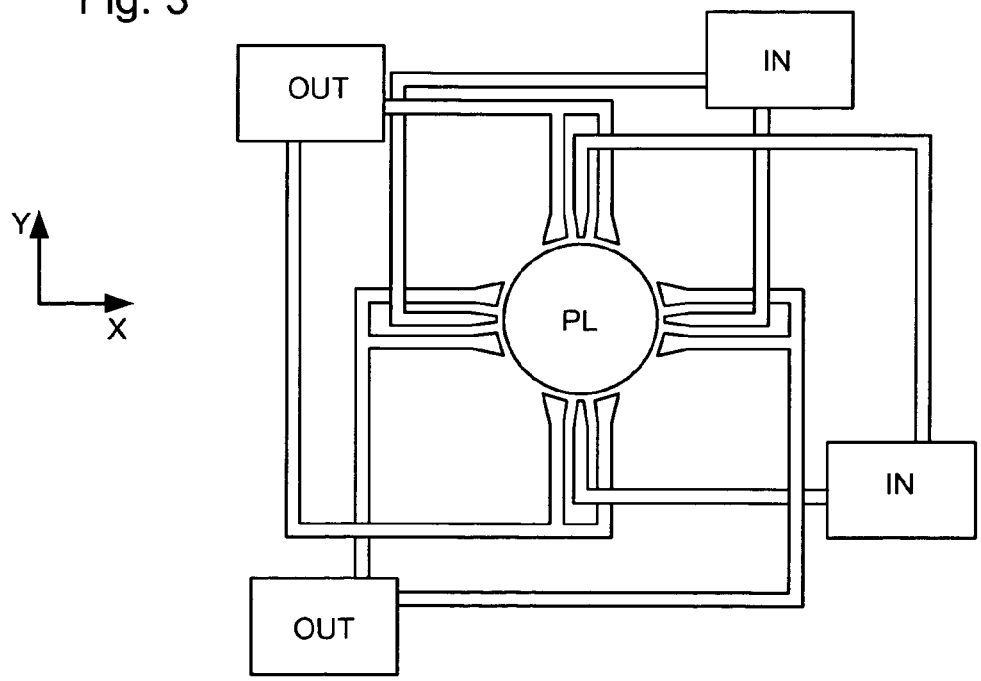

LITHOGRAPHIC APPARATUS AND DEVICE MANUFACTURING METHOD

This application claims priority from European patent application EP 03254116.1, filed Jun. 27, 2003, which is incorporated herein in its entirety.

FIELD

The present invention relates to a lithographic apparatus and a device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning device can comprise one or more programmable mirror arrays. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in United States Patent U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single substrate will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing,"

Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

It has been proposed to immerse the substrate in a lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system.)

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on a localized area of the substrate and in between the final element of the projection system and the substrate (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element to form a liquid reservoir.

However this and other immersion lithography proposals can incur several difficulties. For example, the effect of immersion liquid on resist chemistry is unknown and outgassing of the resist could cause bubbles in the immersion liquid. Bubbles in the immersion liquid would alter the course of the radiation and thus affect the uniformity of the exposure. Furthermore, even with protective measures, the problem of mechanical disturbances due to coupling between the projection apparatus and the substrate via the immersion liquid remains significant.

An alternative method to improve the resolution of lithographic apparatus, as described by L. P. Ghislain et al. in "Near-Field Photolithography with Solid Immersion Lens," App. Phys. Lett. 74, 501–503. (1999), is to provide a solid immersion lens with a high refractive index between the projection system and the substrate. The projection beam is focused on the solid immersion lens and the radiation propagates to the resist through a very thin air (or other gas) gap using an evanescent field (near-field operation mode). The distance between the solid lens and the substrate is made sufficiently small (i.e. less than the wavelength of the radiation) that some photons are transmitted across the gap and the substrate is exposed. This proposal obviously relies on a very small gap between the substrate and the solid lens and the chances of a crash between the two are high.

SUMMARY

Accordingly, it would be advantageous, for example, to provide an alternative method and apparatus with improved resolution. The alternative method and apparatus may alleviate some of the disadvantages of the presence of liquid or the presence of a solid lens.

According to an aspect of the invention, there is provided a lithographic apparatus comprising:
  an illumination system arranged to condition a radiation beam;
  a support structure configured to hold a patterning device, the patterning device being capable of imparting the radiation beam with a pattern in its cross-section;
  a substrate table configured to hold a substrate;
  a projection system arranged to project the patterned radiation beam onto a target portion of the substrate; and
  a liquid supply system configured to supply a liquid between the projection system and the substrate and arranged, such that in use, there is a space not occupied by liquid between the liquid and the substrate.

Problems that may result from the contact between the liquid and the substrate, such as the effect on resist chemistry and outgassing of the resist can be avoided by having a space not occupied by liquid between the liquid and the substrate. Even if a crash occurs between the liquid and the substrate the consequences will not be as serious as a crash between a solid lens and the substrate. The liquid may be dispersed in the system but the substrate will likely not be permanently damaged and the lithographic apparatus will likely not need major repair work. Arrangements to catch liquid dispersed in the event of a crash may easily be provided.

The liquid supply system can include elements to control the position, quantity, shape, flow rate or any other features of the liquid.

A distance between the liquid and the substrate is, in an embodiment, smaller than the wavelength of the radiation and, in an embodiment, less than 100 nm. The distance between the liquid and the substrate should be carefully monitored because if the distance is too great insufficient radiation may be transmitted to the substrate. The distance should also be as uniform as possible to prevent variation in the amount of radiation transmitted. Similarly, the depth of the liquid should be monitored as it affects the focal plane of the entire projection system. Both the distance between the liquid and the substrate and the depth of the liquid should be carefully regulated such that any variations can be compensated for.

To prevent erroneous and unquantified refraction of the radiation, the surface of the liquid closest to the substrate should be substantially parallel to the substrate.

To confine the liquid to form a liquid lens, the liquid supply system may comprise a hydrophobic surface. The hydrophobic surface may, in an embodiment, be of a substantially annular shape to form the liquid lens in the center of the annulus. In an embodiment, a radiation-transmissive hydrophilic surface configured to define the shape of the liquid may be provided. In an embodiment, the hydrophilic surface fills the hole at the center of the annular hydrophobic surface. A metallic electrode may also be used to adjust the shape (including diameter) of the liquid.

For ease of use, the lithographic apparatus may be arranged such that the substrate table is vertically above the projection system.

According to a further aspect of the invention, there is provided a device manufacturing method comprising:
  providing a liquid between a projection system of a lithographic apparatus and a substrate, the liquid forming a liquid lens; and
  projecting a patterned radiation beam through the liquid, then through a space, and then onto a target portion of the substrate using the projection system.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm).

BRIEF DESCRIPTION OF THE DRAWINGS

Embodiments of the invention will now be described, by way of example only, with reference to the accompanying schematic drawings in which:

FIG. 2 depicts a liquid supply system according to an embodiment of the invention;

FIG. 3 is an alternative view of the liquid supply system of FIG. 2;

In the Figures, corresponding reference symbols indicate corresponding parts.

DETAILED DESCRIPTION

Figure 1:
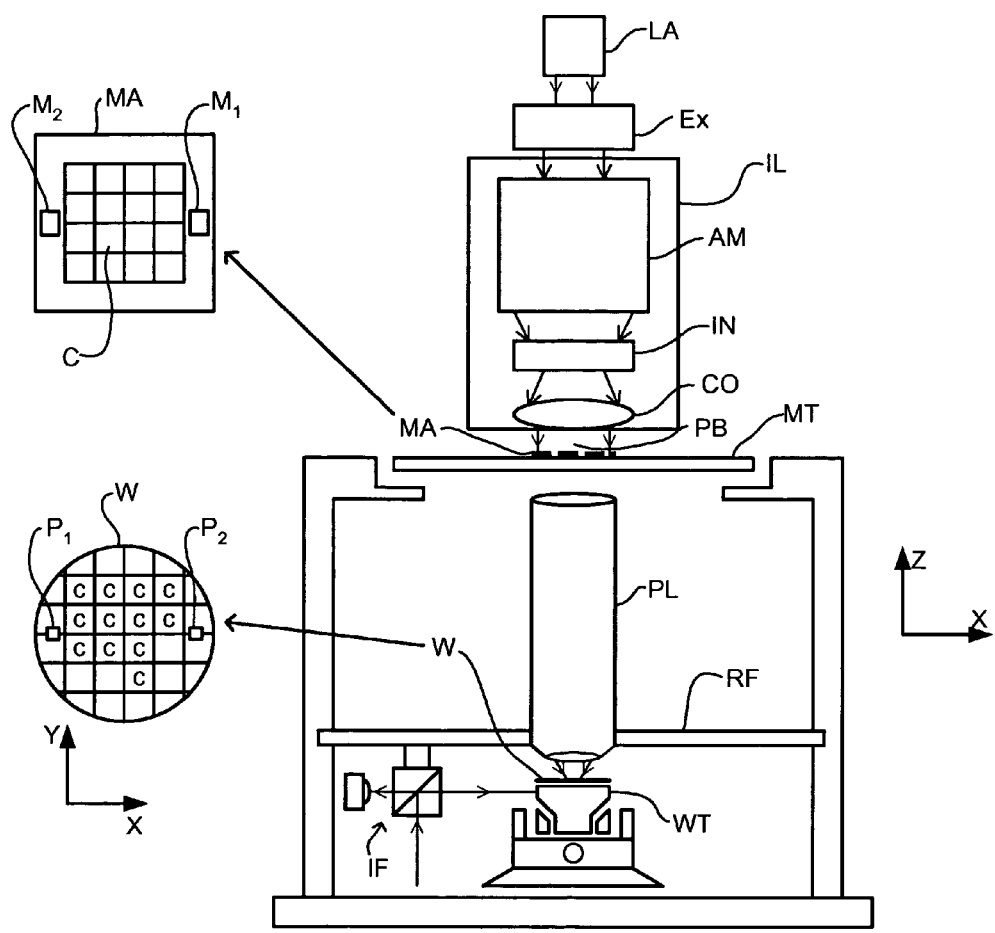
FIG. 1 depicts a lithographic projection apparatus according to an embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. UV radiation), which in this particular case also comprises a radiation source LA;
  a first object table (mask table) MT provided with a mask holder for holding a mask MA (e.g. a reticle), and connected to a first positioning device for accurately positioning the mask with respect to item PL;
  a second object table (substrate table) WT provided with a substrate holder for holding a substrate W (e.g. a resist-coated silicon wafer), and connected to a second positioning device for accurately positioning the substrate with respect to item PL;
  a projection system ("lens") PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. a laser-produced or discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the projection lens PL, which focuses the beam PB onto a target portion C of the substrate W. With the aid of the second positioning device (and an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a stepper (as opposed to a step-and-scan apparatus) the mask table MT may just be connected to a short stroke actuator, or may be fixed.

The depicted apparatus can be used in two different modes:
  1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the projection lens PL (typically, M=¼ or ⅕). In this manner, a relatively large target portion C can be exposed, without having to compromise on resolution.

Figure 4:
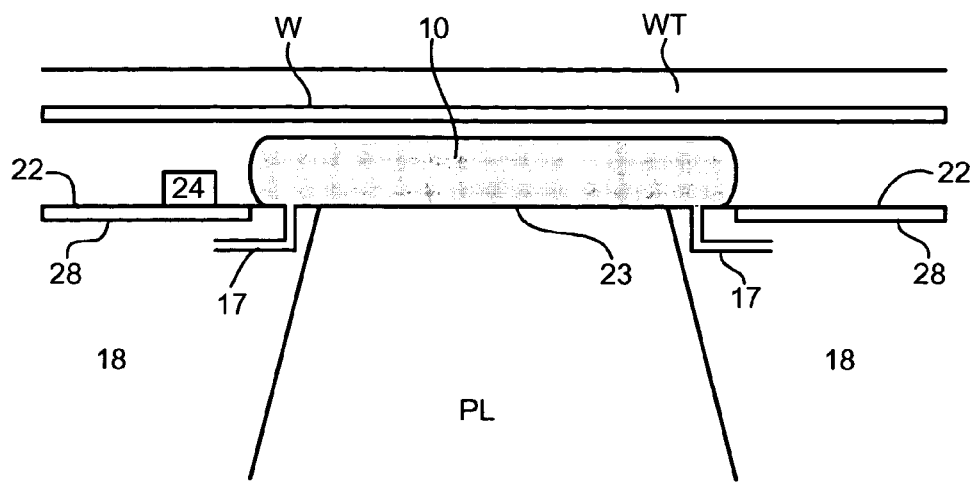
FIG. 4 depicts a detail of a lithographic projection apparatus according to an embodiment of the invention.
Figure 5:
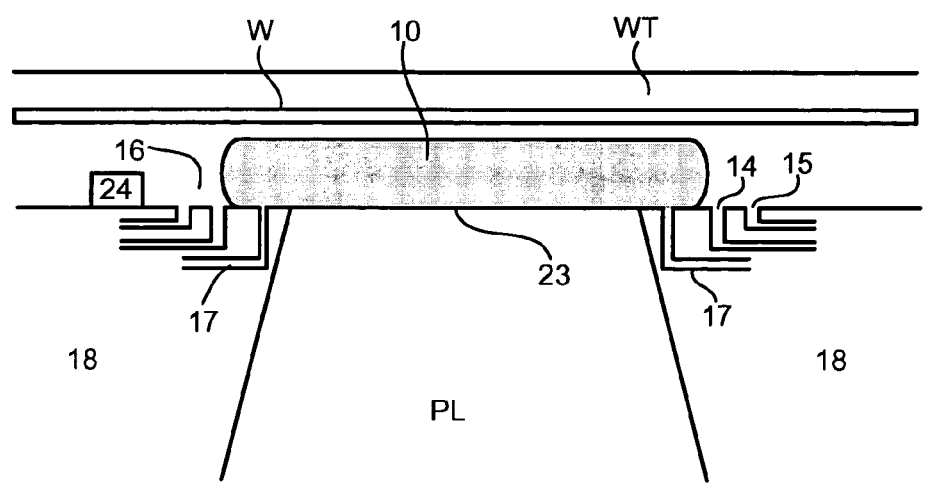
FIG. 5 depicts a detail of an alternative embodiment of a lithographic projection apparatus according to the invention.

As shown in FIGS. 4 and 5, the substrate table WT is above the projection system PL (although as discussed hereafter it need not be). High precision liquid supply system 18 is provided to supply liquid via duct 17 to a space between the projection system PL and the substrate table WT. The liquid has a refractive index n and forms a liquid lens 10 or reservoir. The lens 10 is formed around the image field of the projection system PL so that liquid is confined to a space between the substrate surface and the final element of the projection system PL.

A band of a hydrophobic material 22 (e.g. a coating) is adhered to the liquid supply system 18 which confines liquid in the lens 10. Additionally, the surface of the projection system PL disposed towards the substrate surface comprises a radiation-transmissive hydrophilic material 23 (e.g. a coating) to ensure the lens 10 adheres to the projection system. The specific choice of hydrophobic and hydrophilic materials is dependent on the liquid. For example, when using substantially water as the liquid, glass has been found to be a suitable hydrophilic material and Teflon a suitable hydrophobic material. Other factors such as the degree of roughness of the surface can also be used to improve the hydrophobic quality of a material.

A liquid sensor 24 senses the depth of the liquid lens 10 and the high precision liquid supply system 18 provides enough liquid to substantially fill the space between the projection system PL and the substrate W, but such that there is a gap between the substrate W and the liquid lens 10 of less than the wavelength of the projection radiation. Liquid sensor 24 forms part of a feedback system in which more liquid can be provided into the lens 10 by the high precision liquid supply system 18 when the depth is insufficient and liquid can be removed from the lens 10 by an outlet 14 (or one of the ducts 17 can be used as an outlet) when the depth is too great. The liquid sensor 24 works by sensing radiation from within the liquid lens 10 and using internal reflections from surfaces of the liquid lens to determine the depth of the lens. As the distance between the projection system PL and the substrate W can either be set or alternatively easily measured, the gap between the lens 10 and the substrate W can be calculated by simply subtracting the depth of the lens 10 from the total distance between the projection system PL and the substrate W. Alternatively these distances can be measured by measuring the capacitance between electrodes on, for example, the substrate table WT and the projection system PL.

Radiation is thus projected through the liquid lens 10 and an evanescent field is formed between the substrate W and the surface of the liquid lens 10 disposed towards the substrate surface. The resolution of the system is therefore improved by a factor of n.

The lens 10 should, in an embodiment, have a large flat surface to prevent erroneous refraction of the radiation. By charging (e.g., metallic) electrodes 28 under the hydrophobic material, the shape (form and size of the liquid lens) can be adjusted appropriately. For example, the lens 10 can be adjusted to have a large diameter to provide a large flat area at the center.

Alternatively or additionally to the hydrophobic material 22 and/or hydrophilic material 23, a gas seal 16 may be used to confine the liquid in the lens 10. As shown in FIG. 5, the gas seal is formed by gas, e.g. air, synthetic air, $N_2$ or another inert gas, provided under pressure via inlet 15 to the gap between the high precision liquid supply system 18 and the substrate W and extracted via outlet 14. An overpressure on the gas inlet 15, vacuum level on the outlet 14 and geometry of the gap are arranged so that there is a high-velocity gas flow inwards that confines the liquid.

If the lens 10 is sufficiently small, a lithographic apparatus with the projection system PL above the substrate table WT, as shown in FIG. 1 can be used. Surface tension and adhesion forces compensate for the force of gravity and the lens 10 remains adhered to the projection system PL leaving a space between the lens 10 and the substrate W.

Another liquid supply system which has been proposed, as described in U.S. patent application U.S. Ser. No. 10/705,783, is to provide the liquid supply system with a seal member which extends along at least a part of a boundary of the space between the final element of the projection system and the substrate table. The seal member is substantially stationary relative to the projection system in the XY plane and a seal is formed between the seal member and the surface of the substrate. In an embodiment, the seal is a contactless seal such as a gas seal.

While specific embodiments of the invention have been described above, it will be appreciated that the invention may be practiced otherwise than as described. The description is not intended to limit the invention.

What is claimed is:

1. A lithographic projection apparatus comprising:
    an illumination system arranged to condition a radiation beam;
    a support structure configured to hold a patterning device, the patterning device being capable of imparting the radiation beam with a pattern in its cross-section;
    a substrate table configured to hold a substrate;
    a projection system arranged to project the patterned radiation beam onto a target portion of the substrate; and
    a liquid supply system configured to supply a liquid between the projection system and the substrate and arranged, such that in use, there is a space not occupied by liquid between the liquid and the substrate.

2. An apparatus according to claim 1, wherein a distance between the liquid and the substrate is smaller than the wavelength of the radiation beam.

3. An apparatus according to claim 1, wherein a distance between the liquid and the substrate is less than 100 nm.

4. An apparatus according to claim 1, wherein the majority of the surface of the liquid closest to the substrate is substantially parallel to the substrate.

5. An apparatus according to claim 1, wherein the liquid supply system comprises a hydrophobic surface configured to define a shape of the liquid.

6. An apparatus according to claim 5, wherein the hydrophobic surface is of annular shape.

7. An apparatus according to claim 1, comprising a radiation-transmissive hydrophilic surface configured to define a shape of the liquid.

8. An apparatus according to claim 7, wherein the radiation-transmissive hydrophilic surface is circular, filling a hole at the center of an annular hydrophobic surface.

9. An apparatus according to claim 1, wherein, in use, the substrate table is vertically above the projection system.

10. An apparatus according to claim 1, comprising an electrode configured to adjust the shape of the liquid.

11. A device manufacturing method comprising:
providing a liquid between a projection system of a lithographic apparatus and a substrate, the liquid forming a liquid lens; and
projecting a patterned radiation beam through the liquid, then through a space, and then onto a target portion of the substrate using the projection system.

12. A method according to claim 11, wherein a distance between the liquid and the substrate is smaller than the wavelength of the radiation beam.

13. A method according to claim 11, wherein a distance between the liquid and the substrate is less than 100 nm.

14. A method according to claim 11, wherein the majority of the surface of the liquid closest to the substrate is substantially parallel to the substrate.

15. A method according to claim 11, comprising defining a shape of the liquid using a hydrophobic surface.

16. A method according to claim 15, wherein the hydrophobic surface is of annular shape.

17. A method according to claim 11, comprising defining a shape of the liquid using a radiation-transmissive hydrophilic surface.

18. A method according to claim 17, wherein the radiation-transmissive hydrophilic surface is circular, filling a hole at the center of an annular hydrophobic surface.

19. A method according to claim 11, wherein, in use, the substrate is vertically above the projection system.

20. A method according to claim 11, comprising adjusting the shape of the liquid using an electrode.

21. A lithographic projection apparatus comprising:
an illumination system arranged to condition a radiation beam;
a support structure configured to hold a patterning device, the patterning device being capable of imparting the radiation beam with a pattern in its cross-section;
a substrate table configured to hold a substrate;
a projection system arranged to project the patterned radiation beam onto a target portion of the substrate; and
a liquid supply system configured to supply a peripherally confined portion of liquid between the projection system and the substrate, the substrate being vertically above the configured portion of the liquid, and wherein a space exists between the confined portion of liquid and the substrate.

* * * * *